US006981232B1

(12) United States Patent
Lien et al.

(10) Patent No.: US 6,981,232 B1
(45) Date of Patent: Dec. 27, 2005

(54) METHOD AND SYSTEM FOR INTEGRATING A PROGRAM AND A PROCESSOR INTO AN APPLICATION SPECIFIC PROCESSOR

(75) Inventors: Scott Te-Sheng Lien, Palo Alto, CA (US); John R. Hubbard, Albuquerque, NM (US)

(73) Assignee: Xilinx, Inc., San Jose, CA (US)

( * ) Notice: Subject to any disclaimer, the term of this patent is extended or adjusted under 35 U.S.C. 154(b) by 227 days.

(21) Appl. No.: 10/445,234

(22) Filed: May 23, 2003

(51) Int. Cl.[7] .............................................. G06F 17/50
(52) U.S. Cl. ............................................. 716/3; 716/1
(58) Field of Search ......... 716/1, 3, 12–17; 703/13–17

(56) References Cited

U.S. PATENT DOCUMENTS

| 5,684,980 | A | | 11/1997 | Casselman |
| 5,867,400 | A | | 2/1999 | El-Ghoroury et al. |
| 5,896,521 | A | * | 4/1999 | Shackleford et al. ......... 703/21 |
| 6,006,022 | A | * | 12/1999 | Rhim et al. ..................... 716/1 |
| 6,230,114 | B1 | * | 5/2001 | Hellestrand et al. .......... 703/13 |
| 6,263,302 | B1 | * | 7/2001 | Hellestrand et al. .......... 703/17 |
| 6,477,683 | B1 | | 11/2002 | Killian et al. |
| 6,560,754 | B1 | * | 5/2003 | Hakewill et al. ............... 716/4 |
| 6,760,888 | B2 | * | 7/2004 | Killian et al. ................... 716/1 |

OTHER PUBLICATIONS

Ken Chapman; XAPP627 (v1.1) "PicoBlaze 8-Bit Microcontroller for Virtex-II Series Devices"; Feb. 4, 2003; available from Xilinx, Inc., 2100 Logic Drive, San Jose, California 95124; pp. 1-44.
Ken Chapman; XAPP213 (v2.1) "PicoBlaze 8-Bit Microcontroller for Virtex-E and Spartan-II/IIE Devices"; Feb. 4, 2003; available from Xilinx, Inc., 2100 Logic Drive, San Jose, California 95124; pp. 1-47.
Xilinx, Inc.; XAPP387 (v1.0) "CoolBlaze 8-Bit Microcontroller for CPLD Devices"; Dec. 1, 2002; available from Xilinx, Inc., 2100 Logic Drive, San Jose, California 95124; pp. 1-15.

* cited by examiner

*Primary Examiner*—Matthew Smith
*Assistant Examiner*—Naum Levin
(74) *Attorney, Agent, or Firm*—Kim Kanzaki (57) ABSTRACT

An application specific processor for an application program is provided. First a software description, for example, a HDL description, of a processor is created. A user program is written using the processor's instruction set and compiled and/or assembled into object code. The software description of the processor and the object code are combined and synthesized into a logic gate circuit description, which may be implemented in a Field Programmable Gate Array (FPGA), a Complex Programmable Logic Device (CPLD) or any other Integrated Circuit (IC) having programmable logic modules. Typically, the logic gate circuit description is optimized, hence reducing the number of logic gates and the resources needed.

21 Claims, 9 Drawing Sheets

Arithmetic Group 356
ADD sX,kk
ADDCY sX,kk
SUB sX,kk
SUBCY sX,kk
ADD sX,sY
ADDCY sX,sY
SUB sX,sY
SUBCY sX,sY

Shift and Rotate Group 358
SR0 sX
SR1 sX
SRX sX
SRA sX
RR sX
SL0 sX
SL1 sX
SLX sX
SLA sX
RL sX

Input/Output Group 360
INPUT sX,pp
INPUT sX,(sY)
OUTPUT sX,pp
OUTPUT sX,(sY)

Program Control Group 350
JUMP aa
JUMP Z,aa
JUMP NZ,aa
JUMP C,aa
JUMP NC,aa
CALL aa
CALL Z,aa
CALL NZ,aa
CALL C,aa
CALL NC,aa
RETURN
RETURN Z
RETURN NZ
RETURN C
RETURN NC

Logical Group 352
LOAD sX,kk
AND sX,kk
OR sX,kk
XOR sX,kk
LOAD sX,sY
AND sX,sY
OR sX,sY
XOR sX,sY

Interrupt Group 354
RETURNI ENABLE
RETURNI DISABLE
ENABLE INTERRUPT
DISABLE INTERRUPT

```
······                                    ┌─610
architecture Behavioral of demo is
  component picoblaze
    Port (    address : out std_logic_vector(7 downto 0);
              instruction : in std_logic_vector(15 downto 0);
              port_id : out std_logic_vector(7 downto 0);
              write_strobe : out std_logic;
              out_port : out std_logic_vector(7 downto 0);
              read_strobe : out std_logic;
              in_port : in std_logic_vector(7 downto 0);
              interrupt : in std_logic;
              reset : in std_logic;
              clk : in std_logic);
  end component;                          ┌─612
-- declaration of program ROM
  component demo_test
    Port (address : in std_logic_vector(7 downto 0);
          dout : out std_logic_vector(15 downto 0);
          clk : in std_logic);
  end component;
-- Signals used to connect picoblaze to program ROM and I/O logic
signal address : std_logic_vector(7 downto 0);
signal instruction : std_logic_vector(15 downto 0);        ─614
signal port_id : std_logic_vector(7 downto 0);
signal out_port : std_logic_vector(7 downto 0);
signal in_port : std_logic_vector(7 downto 0);             ─616
signal write_strobe : std_logic;
signal read_strobe : std_logic;
signal interrupt_event : std_logic;
-- signal reset : std_logic;
-- Start of circuit description
begin
  -- Connecting the microprocessor and the program memory   ┌─620
  processor: picoblaze
    port map(   address => address, instruction => instruction, port_id => port_id,
          write_strobe => write_strobe, out_port => out_port, read_strobe =>
read_strobe,
          in_port => in_port, interrupt => interrupt_event, reset => reset, clk => clk);
                                                            ┌─622
  program: demo_test
    port map (address => address, dout => instruction, clk => clk);
  ....

end process IO_registers;
end Behavioral;
```

FIG. 7

| Address | Hex | Binary | Mnemonic |
|---|---|---|---|
| 00 | 0701 | 0000011100000001 | Load s7, 01 |
| 01 | 8F01 | 1000111100000001 | Output s7, 01 |
| 02 | A704 | 1010011100000100 | RL s7 |
| 03 | D501 | 1101010100000001 | Jump 01 |

FIG. 8

```
entity demo_test is                                    ⌐710
    port( address : in std_logic_vector(7 downto 0);
          clk : in std_logic;                          ⌐712
          dout : out std_logic_vector(15 downto 0));
    end;

architecture v1 of demo_test is                        ⌐714
                                                       ⌐718
    constant ROM_WIDTH: INTEGER:= 16;
    constant ROM_LENGTH: INTEGER:= 256;

subtype rom_word is std_logic_vector(ROM_WIDTH-1 downto 0);
    type rom_table is array (0 to ROM_LENGTH-1) of rom_word;

constant rom: rom_table := rom_table'(
    "0000011100000001",
    "1000111100000001",
    "1010011100000100",
    "1101000000000001",
    "0000000000000000",              722
    .....
    "0000000000000000",
    "0000000000000000");

begin process (clk)
begin                                          ⌐724
    if clk'event and clk = '1' then
        dout <= rom(conv_integer(address));
    end if;
end process;
end v1;
```

FIG. 9

METHOD AND SYSTEM FOR INTEGRATING A PROGRAM AND A PROCESSOR INTO AN APPLICATION SPECIFIC PROCESSOR

REFERENCE TO A COMPUTER PROGRAM LISTING APPENDIX

This application includes a computer program-listing appendix on a single compact disc, the contents of which are incorporated herein by reference in their entirety. The compact disc contains a first 5 KB file entitled "arithmetic_vhd.txt", a second 31 KB file entitled "asm_cpp.txt", a third 2 KB file entitled carry_flag_logic_vhd.txt, a fourth 4 KB file entitled demo_Processor_PROM_combined_vhd.txt, a fifth 3 KB file entitled demo_tb_ant.txt, a sixth 1 KB file entitled demo_test_asm.txt, a seventh 7 KB file entitled demo_test_vhd.txt, an eighth 1 KB file entitled flip_vhd.txt, a ninth 2 KB file entitled interrupt_capture_vhd.txt, a tenth 2 KB file entitled interrupt_logic_vhd.txt, an eleventh 2 KB file entitled IO_strobe_logic_vhd.txt, a twelfth 2 KB file entitled logical_bus_processing_vhd.txt, a thirteenth 24 KB file entitled picoblaze_vhd.txt, a fourteenth 3 KB file entitled program_counter_vhd.txt, a fifteenth 3 KB file entitled register_and_flag_enable_vhd.txt, a sixteenth 3 KB file entitled register_bank_vhd.txt, a seventeenth 3 KB file entitled shift_rotate_vhd.txt, an eighteenth 4 KB file entitled stack_counter_vhd.txt, a nineteenth 3 KB file entitled stack_ram_vhd.txt, a twentieth 2 KB file entitled T_state_and_Reset_vhd.txt, and a twenty-first 2 KB file entitled zero_flag_logic_vhd.txt, all of which were created on May 21, 2003. A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention relates generally to computer design and more specifically, to creating an application specific processor.

BACKGROUND

Conventionally, the hardware design of a processor and its associated instruction set is done separately from the writing of application programs for the processor. The processor may be designed using a hardware description language (HDL) such as VHDL or Verilog. The processor HDL description is used to create a processor in an application specific integrated circuit (ASIC) such as the Pentium® processor of Intel® Corp. of Santa Clara, Calif. or in a Field Programmable Gate Array (FPGA), such as the MicroBlaze™ processor of Xilinx Inc. of San Jose, Calif. The application programs are written after the processor has been implemented as an ASIC or in a FPGA. The application programs are typically written in a higher level computer language such as C, C++, VB/VBA, Java, or assembly language, which must be compiled and/or assembled into object code in order to be executed by the processor.

Figure 1:
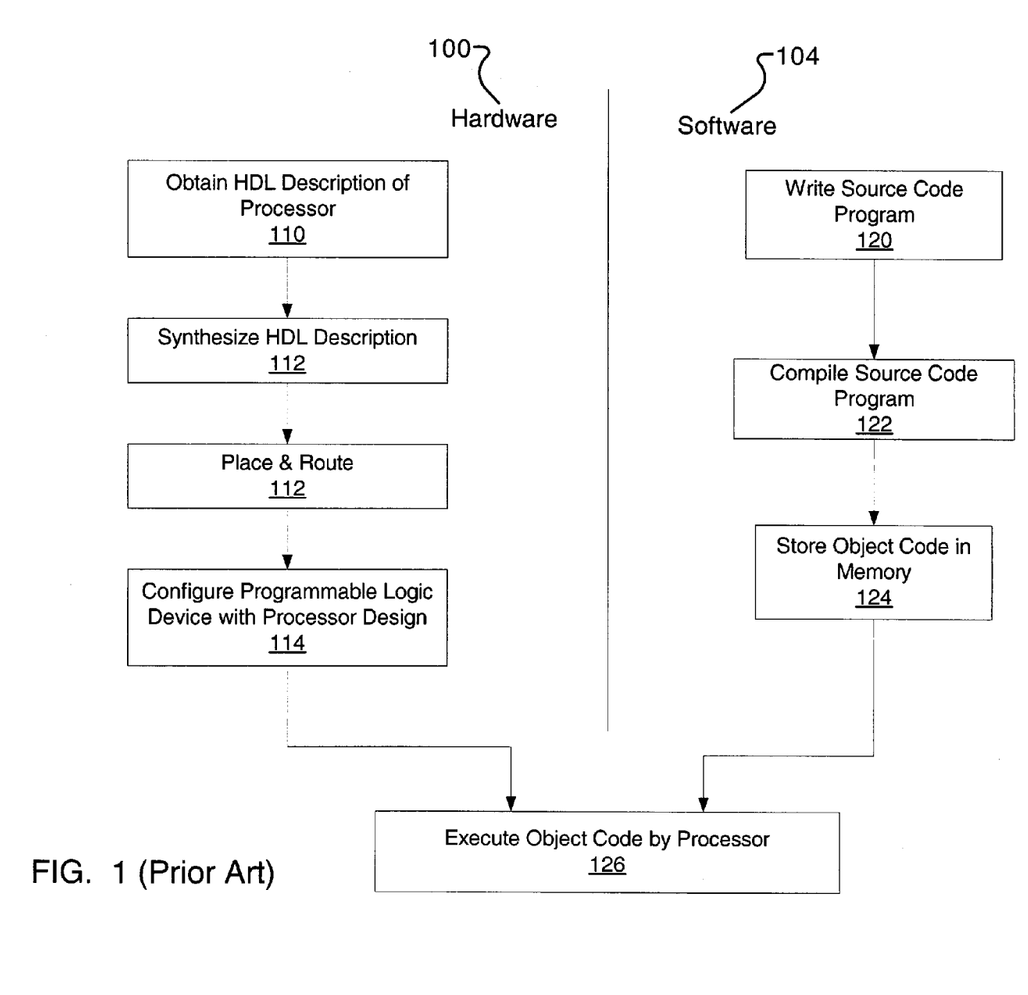
FIG. 1 is a prior art flowchart for implementing a processor on an FPGA (or CPLD) and executing a program on the processor.

FIG. 1 is a prior art flowchart for implementing a processor in an FPGA (or CPLD) and executing an application program on the processor. There are conventionally two sub-flows, a hardware flow 100 and a software flow 104. For the hardware flow 100, at step 110, a HDL description is obtained by developing a new description or by using or modifying an existing description. Associated with the HDL description of the processor is the processor's instruction set, which includes the op-codes. At step 112 the HDL description is synthesized into a netlist, using a synthesis tool such as the FPGA Compiler II from Synopsys® Inc. of Mountain View Calif. The synthesis tool typically uses conventional minimization techniques to reduce the number of logic gates (and other resources) needed to implement the processor. In the case of an FPGA (or CPLD), a place and route tool is next used to determine how the programmable logic blocks in the FPGA (or CPLD) should be placed and routed in the FPGA (or CPLD) (step 112). At step 114 the FPGA (or CPLD) is actually configured using the placed and routed netlist.

The software flow 104 starts at step 120 with writing a source code program using the instruction set for the processor in the hardware flow 100. At step 122 the source code is complied into object code, i.e., binary code. The object code is stored in a memory, such as a programmable read-only memory (PROM) connected to the processor (step 124). At step 126 the object code is executed by the processor configured in the FPGA.

The flowchart of FIG. 1 has in the past been used for the traditional general purpose processor with its "one size fits all" instruction set. However, in recent times a major problem developed—the general purpose processor could not meet the performance criteria for certain application specific domains such as digital signal processing (DSP). Thus processors and their instruction sets were customized for specific application domains. An example, is the DSP processor of Texas Instruments of Dallas, Tex. Another example is the graphics processor of nVIDIA Corporation of Santa Clara, Calif.

While the processors and their instruction sets became more application oriented, the design flow of hardware and software of FIG. 1 was still used. However, the greater correlation between the application domain as represented by the application program, and the customized instruction set and processor, indicated that there was a need for improving the integration of the hardware and software flows of FIG. 1.

Therefore, as the need for application specific processors continues, there is also a need for improved techniques for developing these application specific processors.

SUMMARY

The present invention relates generally to a method and system for combining a processor and a program complied and/or assembled for use by the processor into a single circuit design, where the processor and the single circuit design may be implemented using programmable logic modules.

An exemplary embodiment of the present invention uses a software description, for example, a hardware description language (HDL) description, of a processor and the associated processor instruction set. A user program is written using the instruction set and compiled and/or assembled into object code. The software description of the processor and the object code are combined and synthesized into a logic gate circuit description, which may be implemented in a Field Programmable Gate Array (FPGA), a Complex Programmable Logic Device (CPLD) or any other Integrated Circuit (IC) having programmable logic modules. Typically, the logic gate circuit description is optimized, hence reducing the number of logic gates and the resources needed on the FPGA, CPLD, or any other IC having programmable logic modules. The result is a processor that has been customized to perform one specific application, i.e., the user program. When another user program is written, another logic gate circuit description may be created, i.e., another application specific processor.

An embodiment of the present invention includes a method for creating an application specific circuit design. First, the computer language source code is processed to produce object code. Second, the object code and a second software program are combined into the first software program, where the second software program describes a processor. And lastly, the first software program is converted into a circuit description comprising a plurality of logic gates.

Another embodiment of the present invention includes a method for processing source code by an integrated circuit (IC) having programmable logic modules. First, first code is obtained describing at least part of a processor, where the processor has an associated set of instructions, including op-codes. Next, the object code is generated from the source code, where the source code includes a plurality of commands from the associated set of instructions. Third, second code describing a memory is generated, where the memory includes the object code. Then the first and second code are combined into third code, where the third code describes at least part of the processor and at least part of the memory, and the third code is stored in a computer readable memory. Finally, a netlist, derived from the third code, is formed, where the netlist is to be used for configuring the programmable logic modules to execute the object code.

Yet another embodiment of the present invention includes an application specific processor design, which has: object code for an application program; a first hardware description language description of a processor configured to program an integrated circuit having programmable logic modules; a second hardware description language description of a memory, where the memory includes the object code; and a synthesized netlist derived from the first hardware description language description and the second hardware description language description.

The present invention will be more full understood in view of the following description and drawings.

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention.

Figure 2:
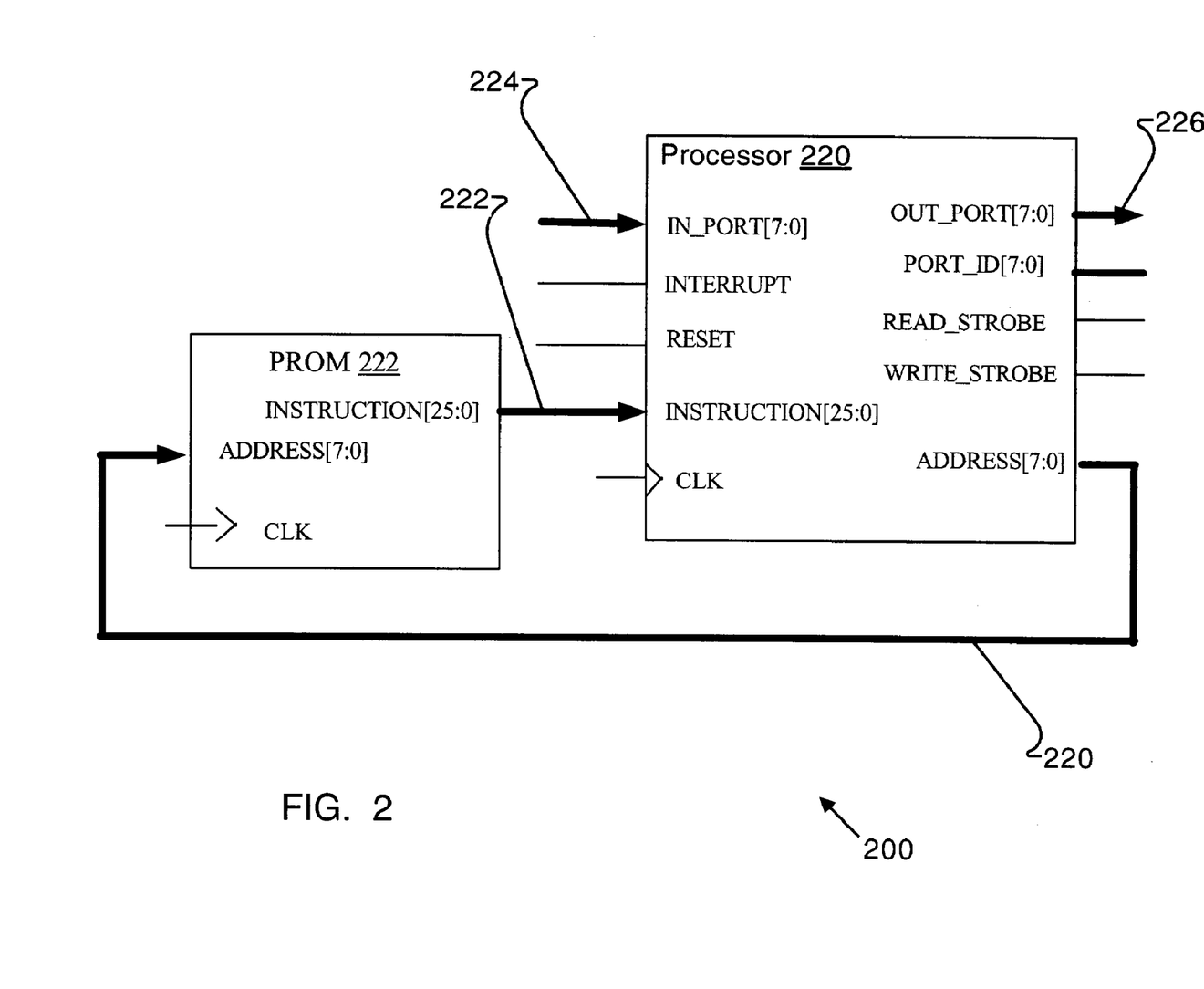
FIG. 2 is a schematic of system having a programmable read-only memory (PROM) connected to a processor.

FIG. 2 is a schematic of system 200 having a programmable read-only memory (PROM) 222 connected to a processor 220. System 200 may be developed and used by following the method in FIG. 1. The HDL description of processor 220 can be obtained, synthesized, and configured in a FPGA or CPLD. A user program can be written using the instruction set for processor 220, assembled, and the object code stored in PROM 222. The processor 220 then reads each instruction 222 from PROM 222 and executes each instruction as known in the art.

In an embodiment of the present invention the system 200 is represented by a HDL description. The HDL description of PROM 222 includes the application program object code. The HDL description of system 200 is then synthesized, placed and routed, and used to configure the FPGA or CPLD or other IC having programmable logic modules. Thus, an application specific processor has been created for one program, i.e., one application. This might be considered the limiting case for application specific processors.

As a program can be a combination of two sub-programs, an alternative embodiment of the present invention includes an application specific processor for two or more programs. A user rather than developing a customized instruction set for his/her specific application domain, may use a general purpose instruction set to develop one or more application programs, which can be then used to create an application specific processor customized for these one or more application programs.

In order to more fully understand embodiments of the present invention, illustrative examples of a processor (FIG. 3), instruction set (FIG. 4), and a program (FIGS. 7, 8, and 9, and the CD computer appendix) are given.

Figure 3:
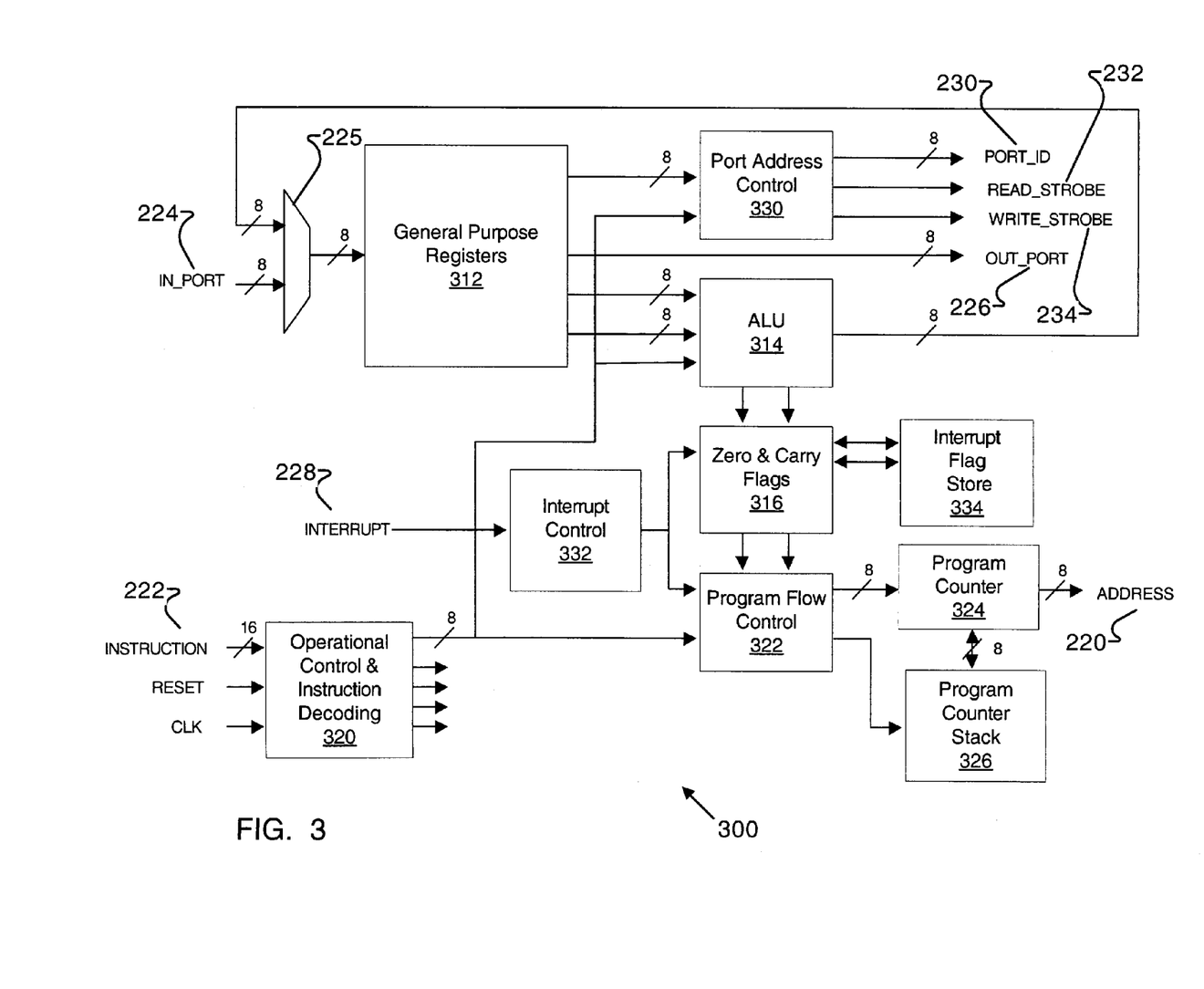
FIG. 3 is a simplified schematic of a microprocessor architecture used in an embodiment of the present invention.

FIG. 3 is a simplified schematic of a microprocessor architecture 300 used in an embodiment of the present invention. The microprocessor architecture 300 describes in more detail the processor 220 of FIG. 2. A program instruction is received via instruction input 222 by the operational control and instruction decoding module 320. The decoded instruction is sent to either the program flow control 322, arithmetic logic unit (ALU) 314, or the port address control 330. The program flow control 322 is coupled to the program counter 324 and the program counter stack 326, where the to the program counter (PC) 324 and the program counter stack 326 are coupled to each other. The PC 324 outputs the address 220 of the next instruction that is to be read into instruction input 222. The zero and carry flags module 316 receives inputs from the ALU 314, interrupt control 332, and interrupt flag store 334 and outputs data to the interrupt flag store 334 and program flow control 322.

There are eight general purpose registers 312 referred to herein as s0 to s7. General purpose registers 312 receive input data from IN_PORT 224 or ALU 314 depending on the selection by multiplexer 225. General purpose registers 312 send output data to either the port address control 330, OUTPUT_PORT 226 or ALU 314.

Processor 220 has access to 256 input ports and 256 output ports. An 8-bit port address provided on the PORT_ID 230 together with a READ strobe 232 or WRITE strobe 234 signal from port address control 330 indicates which port is being accessed. The port address is either supplied in the decoded instruction as an absolute value, or specified indirectly as the contents of one of the eight registers. During an INPUT operation, the value provided at the input port 224 is transferred into one of the eight registers, s0–s7. An input operation is indicated by a READ_STROBE 232 output pulse. During an OUTPUT operation, the contents of one of the eight registers is transferred to the output port 226. A WRITE_STROBE 234 output pulse indicates an output operation.

The Arithmetic Logic Unit (ALU) 314 provides arithmetic, logical, shift, and rotate operations for the 8-bit processing unit 300. All operations are performed using an operand provided by one of the eight general purpose registers 312. The result is returned to the same register. For operations needing a second operand, a second register is specified or a constant 8-bit value is embedded in the instruction. For operations requiring more than eight bits, the addition and subtraction operations include an option to carry. Boolean operators (LOAD, AND, OR, XOR) provide the ability to manipulate and test values.

The results of ALU 314 operation affect the ZERO and CARRY flags 316. Using conditional and non-conditional program flow control instructions, these flags determine the execution sequence of the program. JUMP commands specify absolute addresses within the program space. CALL and RETURN commands provide subroutine facilities for commonly used sections of code. A CALL command is made to a specified absolute address, while a program counter stack 326 preserves the return address by storing a value from the program counter 324. The program counter stack 326 provides for a nested CALL with a depth of up to four levels.

There is a single interrupt input signal 228. Using simple logic, multiple signals can be combined and applied to this one input signal. By default, the effect of the interrupt signal is disabled (masked) and is under program control to be enabled and disabled as required. An active interrupt 228, initiates a "CALL FF" (i.e., a subroutine call to the last program memory location), via the interrupt control 332 for the user to define a suitable course of action. Automatically, the interrupt control 332 preserves the contents of the current ZERO and CARRY flags in the interrupt flag store 334 and disables any further interrupts. A special RETURNI command is used to ensure that the end of an interrupt service routine restores the status of the flags and controls.

Figure 4:
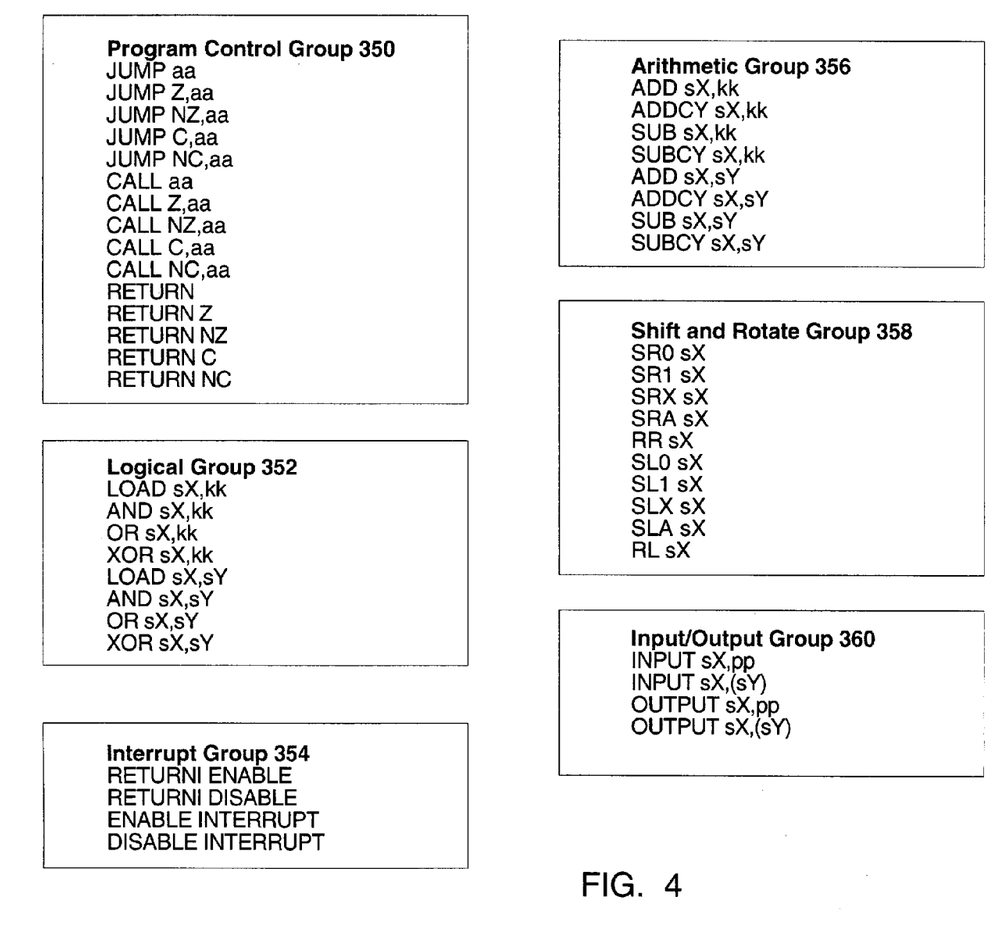
FIG. 4 shows the instruction set for the processor architecture of FIG. 3.

FIG. 4 shows the instruction set for the processor architecture of FIG. 3. The op-codes are divided into six groups: the program control group 350, the logical group 352, the interrupt group 354, the arithmetic group 356, the shift and rotate group 358, and the input/output group 360. The meanings of the symbols used for the operands is as follows: 1. "X" and "Y" refer to the one of the general purpose registers "s" in range 0 to 7; 2. "kk" represents a constant value in range 00 to FF; 3. "aa" represents an address in range 00 to FF; and 4. "pp" represents a port address in range 00 to FF. The explanation for the instructions are as follows:

JUMP—Under normal conditions, the program counter increments to point to the next instruction. The address space is 256 locations (00 to FF hex), making the program counter 8-bits wide. The top of the memory is FF hex and will increment to 00. The JUMP instruction is used to modify the sequence by specifying a new address aa. JUMP aa is an unconditional jump. The JUMP instruction can also be conditional, and a jump to the new address aa is only performed if a test performed on either the ZERO(Z) flag or CARRY(C) flag is valid. "JUMP Z, aa" means jump to aa if Z=0; "JUMP NZ, aa" means jump to aa if Z is NOT zero; "JUMP C, aa" means jump to aa if carry (C=1); "JUMP NC, aa" means jump if NOT carry (C=0). The JUMP instruction has no effect on the status of the flags in zero and carry flags module 316. Each JUMP instruction must specify the 8-bit address as a two-digit hexadecimal value. An assembler/compiler may support labels to simplify this process.

CALL—The CALL instruction is similar in operation to the JUMP instruction. It modifies the normal program execution sequence by specifying a new address aa. The CALL instruction may also be conditional. In addition to supplying a new address, the CALL instruction also causes the current PC value to be pushed onto the program counter stack 326. The CALL instruction has no effect on the status of the zero and carry flags. The program counter stack 326 supports a depth of four address values, enabling a nested CALL sequence to the depth of four levels to be performed. Since the stack is also used during an interrupt operation, at least one of these levels should be reserved when interrupts are enabled. The stack is implemented as a separate buffer. When the stack is full, it overwrites the oldest value. Each CALL instruction specifies the 8-bit address as a two-digit hexadecimal value. To simplify this process, labels are supported in the assembler/compiler.

RETURN—The RETURN instruction is associated with the CALL instruction. The RETURN instruction may also be conditional. The new PC value is formed by incrementing the last value on the program address stack, ensuring the program executes the instruction following the CALL instruction. The RETURN instruction has no effect on the status of the zero and carry flags. The programmer must ensure that a RETURN is only performed in response to a previous CALL instruction, so that the program counter stack contains a valid address.

LOAD—The LOAD instruction loads into a register sX either a constant kk or the contents of a register sY. The LOAD instruction has no effect on the status of the flags. Since the LOAD instruction does not affect the flags, it maybe used to reorder and assign register contents at any stage of the program execution. Because the load instruction is able to assign a constant with no impact to the program size or performance, the load instruction may be used to assign a value or clear a register. For example, "LOAD sX, 00" loads zero into register sX and is the equivalent of a CLEAR register command.

AND—The AND instruction performs a bit-wise logical AND operation between two operands. For example, 00001111 AND 00110011 produces the result 00000011. The first operand is a register sX, and sX is the register assigned the result of the operation. A second operand is a register SY or an 8-bit constant value kk. Flags are affected by the AND operation.

OR—The OR instruction performs a bit-wise logical OR operation between two operands. For example, 00001111 OR 00110011 produces the result 00111111. The first operand is a register sX, which also is assigned the result of this operation. A second operand is a register sY or an 8-bit constant value kk. Flags are affected by the OR operation. For example, "OR sX, 00" will clear the carry flag (set C=0) and set the zero flag (set Z=1), if the contents of register sX are zero without changing the contents of the register sX.

XOR—The XOR instruction performs a bit-wise logical XOR operation between two operands. For example, 00001111 XOR 00110011 produces the result 00111100. The first operand is a register sX, which also is assigned the result of this operation. A second operand is a register sY or an 8-bit constant value kk. The zero flag is affected by this operation and the carry flag will be cleared.

RETURNI—The RETURNI instruction is a special variation of the RETURN instruction. It is at the end of an interrupt service routine called by the CALL FF instruction. The RETURNI is unconditional and loads the program counter with the last address on the program counter stack. The address does not increment in this case, because the instruction at the stored address needs to be executed. The RETURNI instruction restores the flags to the point of interrupt condition. It also determines the future ability of interrupts using ENABLE or DISABLE as an operand. Each RETURNI must specify if a further interrupt is enabled or disabled.

ENABLE INTERRUPT and DISABLE INTERRUPT—These instructions are used to set and reset the INTERRUPT ENABLE flag. Before using ENABLE INTERRUPT, a suitable interrupt routine must be associated with the interrupt address vector (FF).

ADD—The ADD instruction performs an 8-bit unsigned addition of two operands. The first operand is a register sX, which also is assigned the result of this operation. A second operand is a register sY or an 8-bit constant value kk. Flags are affected by this operation.

ADDCY—The ADDCY instruction performs an unsigned addition of two 8-bit operands together with the contents of the CARRY flag. The first operand is a register sX, which also is assigned the result of this operation. A second operand is a register sY or an 8-bit constant value kk. Flags are affected by this operation.

SUB—The SUB instruction performs an 8-bit unsigned subtraction of two operands. The first operand is a register sX, which also is assigned the result of this operation. A second operand is a register sY or an 8-bit constant value kk. Flags are affected by this operation.

SUBCY—The SUBCY instruction performs an 8-bit unsigned subtraction of two operands together with the contents of the CARRY flag. The first operand is a register sX, which also is assigned the result of this operation. A second operand is a register sY or an 8-bit constant value kk. Flags are affected by this operation.

SR0, SR1, SRX, SRA, RR of the shift and rotate group 358 all modify the contents of a single register sX to the right. SL0, SL1, SLX, SLA, RL all modify the contents of a single register sX to the left. These instructions effect the flags.

SR0/SL0—Shifts register sX right/left by one place injecting "0".

SR1/SL1—Shifts register sX right/left by one place injecting "1".

SRX/SLX—Shifts register sX right/left by one place injecting MSB/LSB.

SRA/SLA—Shifts register sX right/left by one place injecting the value of the carry flag.

RR/RL—Rotates register sX right/left by one place injecting LSB/MSB.

INPUT—The INPUT instruction enables data values external to the processor 220 to be transferred into any one of the general purpose registers 312. The port address (in the range 00 to FF) is given by a constant value pp, or indirectly as the contents of a register sY. Flags are not affected by this operation. Note that the READ_STROBE 232 provides an indicator that a port has been read, but it is not essential to indicate a valid address.

OUTPUT—The OUTPUT instruction enables the contents of any one of the general purpose registers 312 to be transferred out of the processor 220. The port address (in the range 00 to FF) is given by a constant value pp, or indirectly as the contents of a register sY. Flags are not affected by this operation. The WRITE_STROBE 234 is to ensure the transfer of valid data.

Figure 5:
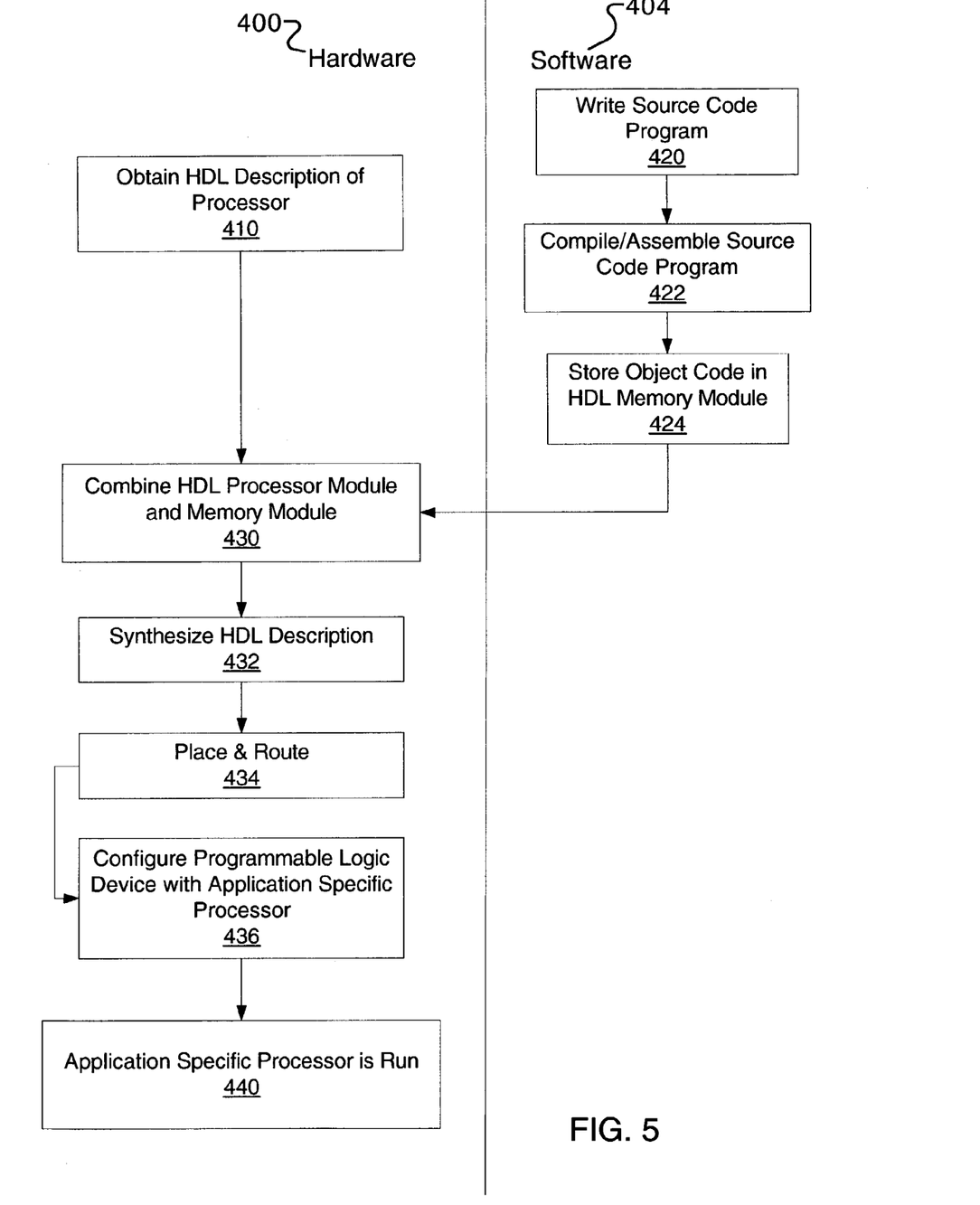
FIG. 5 is a flowchart of process of creating an application specific processor of an embodiment of the present invention.

FIG. 5 is a flowchart of a process of creating an application specific processor of an embodiment of the present invention. The software flow 404 starts at step 420 with writing an application source code program using the instruction set for the processor. At step 422 the source code is complied/assembled into object code. The object code is stored in a HDL memory module (step 424).

For the hardware flow 400, at step 410 a HDL description is obtained by developing a new description or by using or modifying an existing description. Associated with the HDL description of the processor is the processor's instruction set. At step 430, the HDL description of the processor from step 410 is combined with the HDL memory module having the object code from step 424. At step 432 the combined HDL description is synthesized into a netlist. The synthesis tool typically uses conventional minimization techniques to reduce the number of logic gates needed to implement the combined description. In the case of an FPGA (or CPLD or other IC having programmable logic modules), a place and route tool is next used to determine how the programmable logic blocks in the FPGA (or CPLD or other IC having programmable logic modules) should be configured (step 434). At step 436 the FPGA (or CPLD or other IC having programmable logic modules) is actually configured using the placed and routed netlist. At step 440, the application specific processor is run, which results in the execution of the object code.

In one embodiment the method of FIG. 5 can be used to put the processor and memory module, such as that shown in FIG. 2, into a single CPLD (or FPGA). The combined synthesizable VHDL description of system 200 is no longer a general-purpose processor coupled to a memory module having a user program, but an application specific processor or state machine. Unlike the implementation of the general-purpose processor alone in which all the registers and program stack use CPLD resources, the integrated solution optimizes unused functions and removes unnecessary registers. In addition, the processor and memory integration efficiently implements the program memory decoding.

Figure 6:
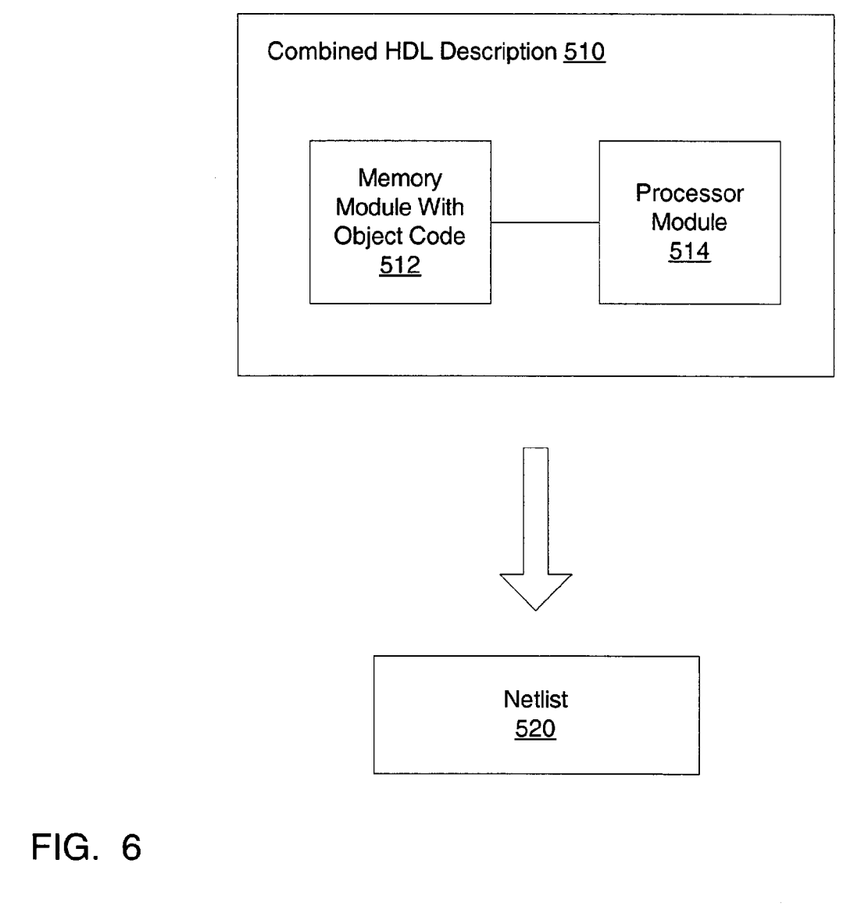
FIG. 6 shows the combined HDL description of the processor and memory module used in FIG. 5 of an embodiment of the present invention.

FIG. 6 shows the combined HDL description 510 of the processor and memory module used by step 430 of FIG. 5 of an embodiment of the present invention. The combined HDL description 510 includes memory module with object code 512 connected to processor module 514. The combined HDL description 510 is synthesized to give netlist 520 (as given by step 432 of FIG. 5).

Figure 7:
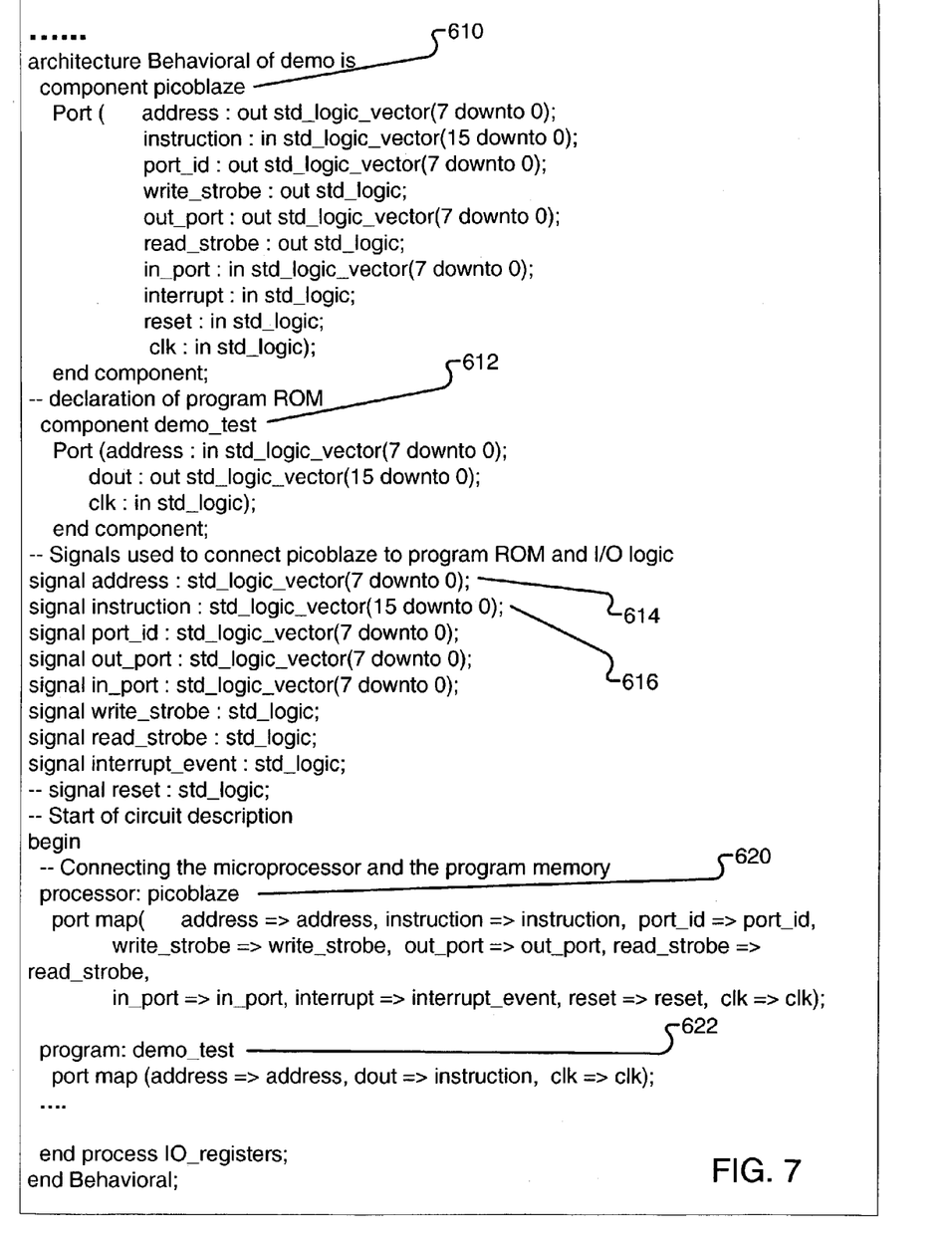
FIG. 7 is an example of a VHDL description of the combined HDL description.

FIG. 7 is an example of a VHDL description of the combined HDL description 510. The component picoblaze 610 is an example of the processor module. The VHDL code is given in the file picoblaze_vhd.txt in the appendix. The component demo_test 612 is an example of the memory module 512. The processor VHDL code is given in FIG. 9, which will be subsequently explained. An illustration of how the processor and memory modules are connected is shown by signals: address 614 and instruction 616, and picoblaze 620 and demo_test 622 instantiations of components picoblaze 610 and demo_test 612, respectively.

The example program which will be assembled and stored in memory module 512 (demo_test) is of rotating a bit to the left. The program is written by the user in assembly language.

Table 1 shows the assembly language instructions for the shifter that rotates its contents one bit to the left at a time (the MSB value shifted out is inserted as the LSB). More specifically, the example in Table 1 loads an integer value 1 into general purpose register s7 and rotates this value to the left one bit position at a time in an infinite loop. The contents of register s7 are output by the processor via port number 01.

TABLE 1

| Assembly Instructions | Comments |
|---|---|
| Constant shifter_port, 01; | declare port |
| Namereg s7, shifter_reg; | declare register |
| Load shifter_reg, 01; | initialize shifter_reg s7 with constant 1 |
| loop1: Output shifter_reg, shifter_port; | Output shifter_reg s7 to port 01 |
| RL shifter_reg; | rotate left by one bit |
| Jump loop1; | goto label loop1 |

The appendix includes file demo_test_asm.txt, which has the assembly language instructions for Table 1 above, and file asm_cpp.txt which has a source code example of an assembler.

Figure 8:
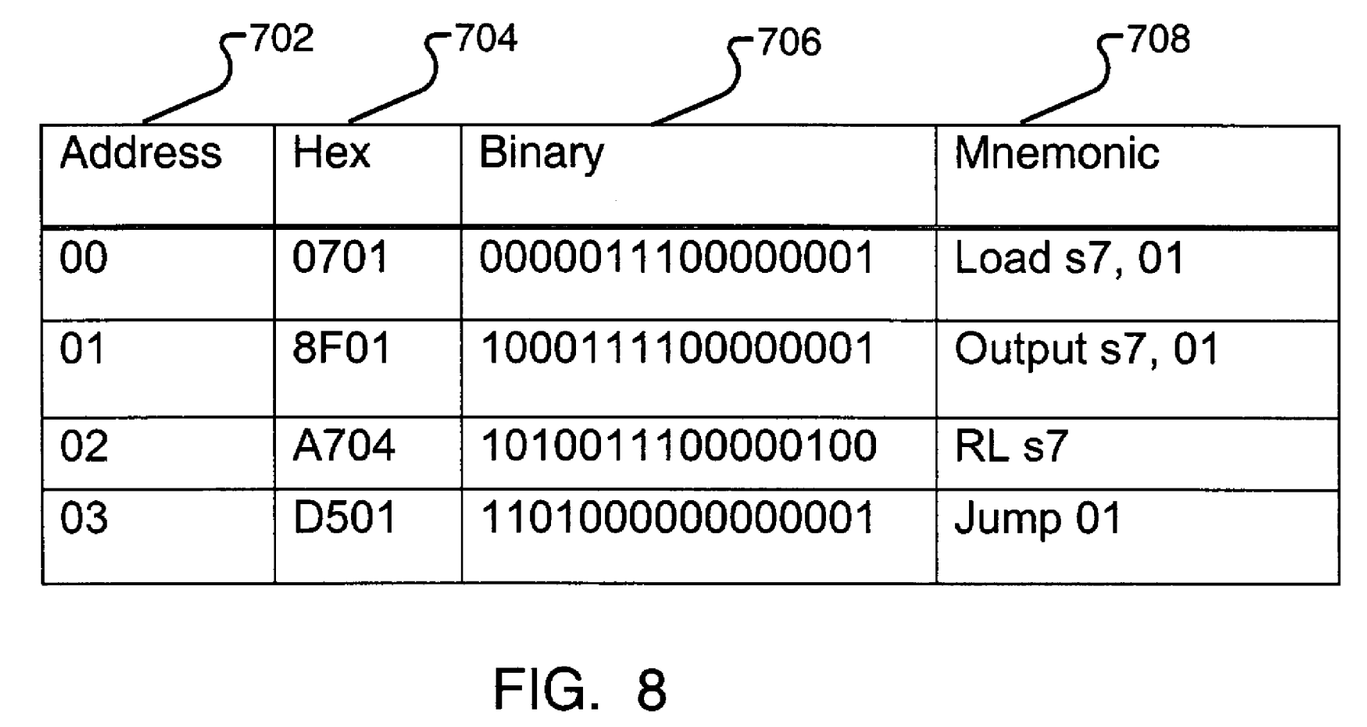
FIG. 8 has the object code for the shifter program.

FIG. 8 has the object code for the shifter program of

Table 1 above. Address 702 is an index into the array 720 of FIG. 9 or the address in memory module 512. Hex 704 is the hexadecimal value for the binary instruction 706 (i.e., object code). Mnemonic 708 is interpreted using the instructions given in FIG. 4.

Figure 9:
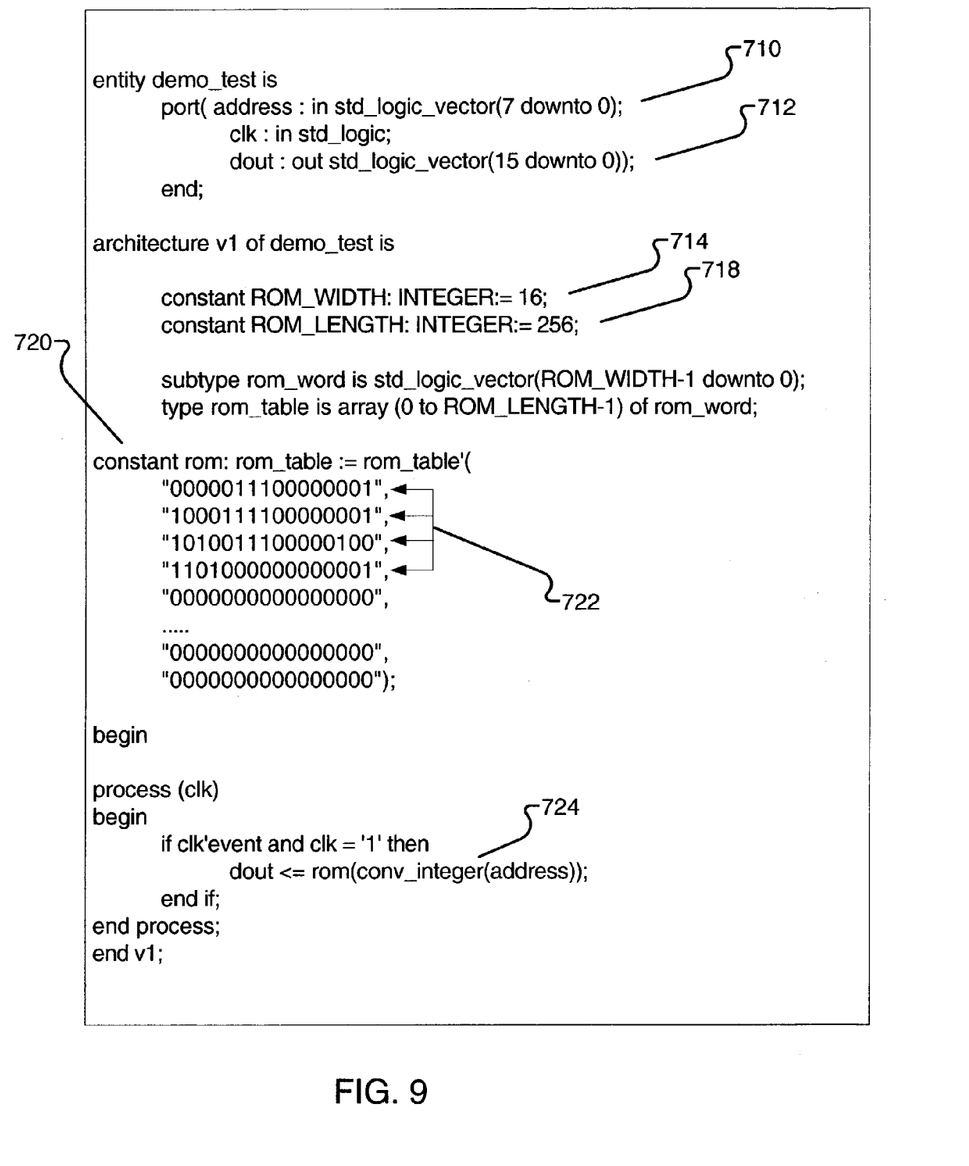
FIG. 9 is the example VHDL code for the demo_test component (memory module) of FIG. 7.

FIG. 9 is the example VHDL code for the demo_test component 612 of FIG. 7 (memory module 512 of FIG. 5). The memory module receives the address 710 from the processor, looks up the instruction 722 in table 720, and outputs the object code instruction as dout 712. The instruction assignment is synchronized with the rising clock edge as shown by signal assignment statement 724.

Thus in an exemplary embodiment of the present invention a method for processing source code by an integrated circuit having programmable logic circuitry has been described. The method includes: obtaining a first hardware description language (HDL), such as VHDL or Verilog, code for a processor; generating the object code from the source assemble language code; generating a second hardware description language code describing a memory, the memory having the object code; integrating the first and second hardware description language code into third hardware

What is claimed is:

1. A method for creating an application specific circuit design, the method comprising:
   processing computer language source code to produce object code;
   combining into a first software program, the object code and a second software program, the second software program describing a processor;
   associating the object code with a third software program describing a memory, and wherein the combining into the first software program, the object code and the second software program, comprises integrating the second software program and the third software program into the first software program; and
   converting the first software program into a circuit description comprising a plurality of logic gates; and
   wherein said computer language source code is configured to execute a user application program using said processor's unmodified instruction set; and
   wherein the computer language source code comprises a plurality of instructions from an instruction set associated with the processor.

2. The method of claim 1 wherein the converting comprises synthesizing and optimizing the first software program into the circuit description.

3. The method of claim 1 wherein the processor is a general purpose microprocessor.

4. The method of claim 1 wherein the first and second software programs comprise hardware description language statements.

5. A method for processing source code by an integrated circuit having programmable logic modules, the method comprising:
   obtaining first code describing at least part of a processor, the processor having an associated set of instructions;
   generating the object code from the source code, the source code consisting of a plurality of commands from the associated set;
   generating second code describing a memory, the memory comprising the object code;
   combining the first and second code into third code, the third code describing at least part of the processor and at least part of the memory, the third code stored in a computer readable memory; and
   forming a netlist derived from the third code, the netlist for configuring the programmable logic modules to execute the object code.

6. The method of claim 5 wherein the generating the object code from the source code comprises compiling or assembling, or a combination thereof, the source code to produce the object code.

7. The method of claim 5 wherein the first and second code comprise hardware description language code.

8. The method of claim 7 wherein the hardware description language code comprise VHDL or Verilog code.

9. The method of claim 5 wherein the source code comprises assembly language code, the assembly language code related to the processor.

10. The method of claim 5 wherein the source code comprises a high level language.

11. The method of claim 10 wherein the high level language is selected from a group consisting of an assembly language, C, C++, C#, Java, NET., and VB/VBA.

12. The method of claim 5 wherein the second code comprises an array describing the memory.

13. The method of claim 5 wherein the netlist is an optimized netlist.

14. The method of claim 5 further comprising:
   placing and routing the netlist; and
   configuring the programmable logic modules using the placed and routed netlist.

15. The method of claim 5 wherein the forming a netlist derived from the third code comprises, synthesizing the netlist from the third code using a synthesis computer tool, the synthesis computer tool performing optimization operations in producing the netlist.

16. A method for processing source code by an integrated circuit having programmable logic circuitry, the method comprising:
   obtaining first hardware description language (HDL) code for a processor;

generating the object code from the source code;

generating second hardware description language code describing a memory, the memory having the object code;

wherein said object code excludes any change to an initial instruction set for said processor;

integrating the first and second hardware description language code into third hardware description language code, the third hardware description language code describing the processor coupled to the memory;

creating a netlist by synthesizing the third hardware description language code, wherein the synthesizing reduces the programmable logic circuitry needed to execute the object code;

place and routing the netlist; and configuring the programmable logic circuitry using the placed and routed netlist.

17. An application specific processor design, comprising:

means for processing computer language source code to produce object code;

said processing computer language source code comprising one of a plurality of user application programs configured to execute on a processor, wherein the computer language source code comprises a plurality of instructions from an instruction set associated with the processor means for combining into a first software program, the object code and a second software program and a third software program, the second software program describing a processor and the third software program describing a memory; and means for converting the first software program into a circuit description comprising a plurality of logic gates.

18. An application specific processor design, comprising:

object code for an application program;

a first hardware description language description of a processor configured to program an integrated circuit having programmable logic modules;

wherein said object code is configured to execute on a predetermined initial set of processor operation codes for said processor;

a second hardware description language description of a memory, the memory comprising the object code; and a synthesized netlist derived from the first hardware description language description and the second hardware description language description.

19. The application specific processor design of claim 18, wherein synthesized netlist is used to program the integrated circuit having programmable logic modules.

20. The application specific processor design of claim 18 further comprising a placed and routed netlist for programming the programmable logic modules, the placed and routed netlist derived from the synthesized netlist.

21. The application specific processor design of claim 18 wherein the hardware description language is ABEL or VHDL or Verilog.

* * * * *